US010782131B2

(12) United States Patent
Arndt et al.

(10) Patent No.: US 10,782,131 B2
(45) Date of Patent: Sep. 22, 2020

(54) QUADRATURE ADC FEEDBACK COMPENSATION FOR CAPACITIVE-BASED MEMS GYROSCOPE

(71) Applicant: Apple Inc., Cupertino, CA (US)

(72) Inventors: Gregory B. Arndt, Campbell, CA (US); Christopher C. Painter, Dublin, CA (US)

(73) Assignee: Apple Inc., Cupertino, CA (US)

( * ) Notice: Subject to any disclaimer, the term of this patent is extended or adjusted under 35 U.S.C. 154(b) by 350 days.

(21) Appl. No.: 15/908,660

(22) Filed: Feb. 28, 2018

(65) Prior Publication Data
US 2019/0265036 A1 Aug. 29, 2019

(51) Int. Cl.
| | |
|---|---|
| G01C 19/5776 | (2012.01) |
| H03M 1/06 | (2006.01) |
| G01D 5/24 | (2006.01) |
| H03D 3/00 | (2006.01) |
| H03D 3/02 | (2006.01) |
| H03G 3/20 | (2006.01) |

(52) U.S. Cl.
CPC ........... *G01C 19/5776* (2013.01); *G01D 5/24* (2013.01); *H03D 3/002* (2013.01); *H03D 3/02* (2013.01); *H03M 1/0626* (2013.01); *H03G 3/20* (2013.01)

(58) Field of Classification Search
CPC ...... G01C 19/5776; G01D 5/24; H03D 3/002; H03D 3/02; H03M 1/0626; H03G 3/20
USPC .............................................. 73/504.12, 497
See application file for complete search history.

(56) References Cited

U.S. PATENT DOCUMENTS

| | | | | |
|---|---|---|---|---|
| 7,240,533 | B2 * | 7/2007 | Fell ..................... | G01C 19/5677 73/1.38 |
| 7,290,435 | B2 * | 11/2007 | Seeger ............... | G01C 19/5719 73/1.37 |
| 9,410,806 | B2 | 8/2016 | Ezekwe | |
| 2011/0192226 | A1 * | 8/2011 | Hayner .............. | G01C 19/5776 73/504.12 |
| 2015/0057959 | A1 * | 2/2015 | Ezekwe ............. | G01C 19/5776 702/96 |
| 2015/0276407 | A1 * | 10/2015 | Bhandari ........... | G01C 19/5776 73/504.12 |
| 2016/0231119 | A1 * | 8/2016 | Beaulaton .......... | G01C 19/5762 |
| 2017/0307374 | A1 * | 10/2017 | Hughes .............. | G01C 19/5712 |
| 2017/0328712 | A1 | 11/2017 | Collin et al. | |
| 2017/0328713 | A1 * | 11/2017 | Beaulaton .......... | G01C 19/5776 |

* cited by examiner

*Primary Examiner* — Nathaniel T Woodward
(74) *Attorney, Agent, or Firm* — Fish & Richardson P.C.

(57) ABSTRACT

A quadrature ADC feedback compensation system and method for MEMS gyroscope is disclosed. In an embodiment, a MEMS gyroscope comprises an analog processing chain including a drive circuit for generating an analog drive signal and a sense circuit that is configured to generate an analog rate signal and an analog quadrature signal in response to a change in capacitance output by the MEMS gyroscope. A compensation circuit coupled to the sense circuit is configured to null the analog quadrature signal using the analog drive signal and a compensation value, and to adaptively compensate, in a digital processing chain, a quadrature-induced rate offset of a digital rate signal over temperature using a digital quadrature signal, the compensation value and temperature data.

18 Claims, 7 Drawing Sheets

QUADRATURE ADC FEEDBACK COMPENSATION FOR CAPACITIVE-BASED MEMS GYROSCOPE

TECHNICAL FIELD

This disclosure relates generally to systems and methods for compensating quadrature-induced rate offset in capacitive-based micro-electrical-mechanical system (MEMS) gyroscopes.

BACKGROUND

A typical vibratory capacitive-based MEMS gyroscope ("gyro") includes a proof-mass that is suspended above a cavity in a semiconductor substrate by a mechanical suspension system that includes flexible beams. The proof-mass is driven into resonance in a drive direction by an external periodic electrostatic or electromagnetic force. When the gyroscope is subjected to an angular rotation, a sinusoidal Coriolis force is induced in a direction orthogonal to the drive-mode oscillation at the driving frequency. The Coriolis force is proportional to the amplitude of the drive motion. To precisely determine the rotation rate around the rotation axis, a feedback control system is used to assure a constant-amplitude oscillation of the proof mass in the drive direction. Since the output of the gyro is typically very small, the control system also forces the proof mass to vibrate at resonance to achieve maximum sensitivity. A transducer is used to covert the displacement of the proof mass due to the Coriolis force to a capacitance variation signal, which can then be converted into a voltage signal using a capacitance-to-voltage (C2V) converter. A self-oscillating loop architecture can be used to control the sensor, which includes one or more filtering stages, a C2V converter, a phase-locked loop (PLL) and an analog-to-digital converter (ADC) to produce a clean signal with the same frequency as the drive frequency.

The performance of a capacitive-based MEMs gyro (e.g., bias stability, angular random walk, dynamic range, temperature stability) is typically affected by mechanical quadrature. Some sources of mechanical quadrature include proof-mass imbalances, driving force and stiffness asymmetry. A significant amount of rate offset arises from the mechanical quadrature signal coupling into the rate signal due to phase errors that occur over time or temperature. This quadrature-induced rate offset may be compensated by measuring the mechanical quadrature at the output of the ADC and then applying this value with a temperature coefficient to the rate signal. This technique, however, limits the gyroscope detection gain and requires a high full-scale range C2V converter to accommodate both the rate change and the quadrature signal, which limits the signal-to-noise (SNR) performance of the C2V. The mechanical quadrature may also be nulled by coupling the drive voltage through a capacitor into the C2V converter. Nulling the quadrature at the input of the C2V converter allows for larger rate signals to improve the SNR of the sensor, but eliminates the possibility of later using the mechanical quadrature to compensate the quadrature-induced rate offset over temperature.

SUMMARY

A quadrature analog-to-digital converter (ADC) feedback compensation system and method for a micro-electrical-mechanical system (MEMS) gyroscope is disclosed.

In an embodiment, a system for compensating rate offset of a micro-electromechanical systems (MEMS) gyroscope comprises: an analog processing chain comprising: a drive circuit configured to generate an analog drive signal for driving a resonating element into resonance; a sense circuit coupled to the drive circuit and the resonating element, the sense circuit configured to generate an analog rate signal and an analog quadrature signal in response to a change in capacitance output by the MEMS gyroscope; and one or more analog-to-digital converters coupled to the sense circuit and configured to convert the analog rate and analog quadrature signals into digital rate and digital quadrature signals, respectively; a compensation circuit coupled to the sense circuit and configured to null the analog quadrature signal using the analog drive signal and a compensation value; and a digital processing chain coupled to the analog processing chain, the digital processing chain comprising: a digital processing circuit configured to adaptively compensate quadrature-induced rate offset of the digital rate signal over temperature using the digital quadrature signal, the compensation value and temperature data.

In an embodiment, a method of compensating rate offset of a micro-electromechanical systems (MEMS) gyroscope comprises: generating, by a drive circuit coupled to a resonating element, an analog drive signal for driving the resonating element into resonance; generating, by a sense circuit coupled to the drive circuit and the resonating element, an analog rate signal and an analog quadrature signal in response to a change in capacitance output by the MEMS gyroscope; converting, by one or more analog-to-digital converters coupled to the sense circuit, the analog rate signal and the analog quadrature signal into a digital rate signal and a digital quadrature signal, respectively; nulling, by a compensation circuit coupled to the sense circuit, the analog quadrature signal using the analog drive signal and a compensation value; and adaptively compensating, by a digital processing circuit, a quadrature-induced rate offset of the digital rate signal over temperature using the digital quadrature signal, the compensation value and temperature data.

In an embodiment, an electronic system comprises: a drive circuit configured to generate an analog drive signal for driving a resonating element into resonance; a sense circuit coupled to the drive circuit and the resonating element, the sense circuit configured to generate an analog rate signal and an analog quadrature signal in response to a change in capacitance output by the MEMS gyroscope; and one or more analog-to-digital converters coupled to the sense circuit and configured to convert the analog rate and analog quadrature signals into digital rate and digital quadrature signals, respectively; a compensation circuit coupled to the sense circuit and configured to null the analog quadrature signal using the analog drive signal and a quadrature compensation value; and a digital processing circuit configured to adaptively compensate quadrature-induced rate offset of the digital rate signal over temperature using the digital quadrature signal, the quadrature compensation value and temperature data; one or more processors; memory coupled to the one or more processors and storing instructions that when executed by the one or more processors, cause the one or more processors to perform operations comprising: obtaining the digital rate signal; calculating orientation data of the electronic system using the digital rate signal; and providing the orientation data to one or more client applications or electronic system components.

Particular implementations disclosed herein provide one or more of the following advantages. A user-programmable compensation value is used to null the mechanical quadrature at the input of a C2V converter in the analog domain to improve the SNR at the C2V converter. The compensation value is then applied (e.g., added) to a digitized quadrature signal in the digital to provide adaptive rate offset compensation over temperature.

The details of the disclosed implementations are set forth in the accompanying drawings and the description below. Other features, objects and advantages are apparent from the description, drawings and claims.

DESCRIPTION OF DRAWINGS

The same reference symbol used in various drawings indicates like elements.

DETAILED DESCRIPTION

System Overview

The disclosed quadrature ADC feedback compensation system couples a known amount of drive voltage into a first stage C2V converter to null a mechanical quadrature signal in the analog domain to improve SNR, and also uses a digitized quadrature signal to compensate for quadrature-induced rate offset over temperature in the digital domain. In an embodiment, a compensation value (e.g., a quadrature trim coefficient) is used to null the quadrature signal in the analog domain with, for example, to set the gain of a programmable gain amplifier (PGA) to the compensation value. In an embodiment, the compensation value is user-programmable and can be stored in cache memory or hardware register. The compensation value is applied (e.g., added) to the digitized quadrature signal in the digital domain to compensate for quadrature-induced rate offset over temperature.

The rate offset is a function of mechanical quadrature error:

$$Rate_{off} = Quad_M \cdot \sin(\varphi) = Quad_M \cdot \varphi. \quad [1]$$

where is the $Quad_M$ is the mechanical quadrature error, $\varphi$ is the phase error, assuming a small-angle approximation. The rate offset results from a phase error coupling the quadrature signal into the rate signal during synchronized demodulation. Both quadrature and phase can drift over time and temperature, subsequently causing rate offset drift.

Because quadrature can be much higher than the desired sense full-scale range (e.g., ~2000 dps), some solutions null the quadrature signal directly at the C2V converter inputs with the drive signal. This design allows the gyro gain ($G_{out}$) of the sense transfer function (Farad/dps) to be maximized to improve the SNR of the C2V converter. The quadrature signal, however, is not available for adaptive rate offset compensation over temperature in the digital domain. For rate offset compensation, these embodiments use a set of fixed coefficients regardless of the quadrature value, as shown in reference to FIG. 1. Because this design does not adapt to changes in the quadrature signal, and therefore is prone to rate offset drift and changes in rate offset over temperature.

Other solutions do not null the inputs of the C2V converter, but instead allow the full quadrature signal to be digitized for use in adaptive quadrature-induced rate offset compensation over temperature in the digital domain. These solutions limit $G_{out}$ to allow use of the full-scale quadrature range. This means that $G_{out}$ cannot be maximized to allow the best SNR at the input of the C2V converter.

In sum, existing solutions for quadrature compensation either null the quadrature signal at the C2V converter in the analog domain to improve SNR or digitize the quadrature signal for use in adaptive quadrature-induced rate offset compensation over temperature in the digital domain, but not both.

Example Quadrature Compensation Systems

Figure 1:
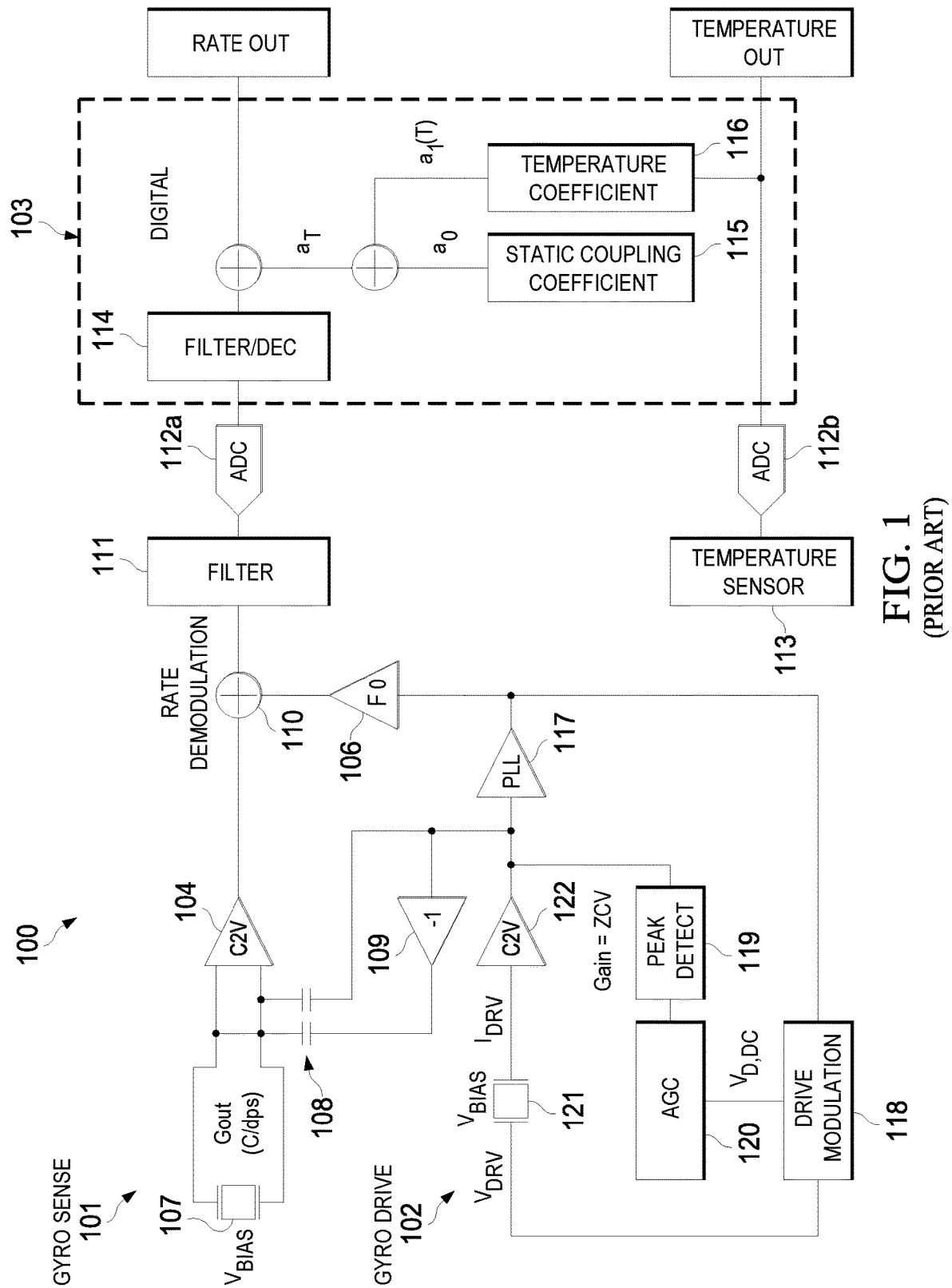
FIG. 1 is a block diagram of an example system for quadrature compensation that uses a drive signal to null the mechanical quadrature at the inputs of a C2V converter in the analog domain, according to an embodiment.

FIG. 1 is a block diagram of an example system 100 for quadrature compensation that uses a drive voltage signal to null the mechanical quadrature error at the inputs of a sense C2V converter in the analog domain, according to an embodiment. In an embodiment, system 100 includes MEMS gyro sensor 101, drive circuit 102 and digital processing circuit 103.

MEMS gyro sensor 101 includes C2V converter 104, displacement-to-capacitance transducer 107, differential coupling capacitors 108, phase inverter 109 and rate signal demodulator 110. In this embodiment, MEMS gyro sensor 101 is a capacitive-based MEMS sensor that uses differential capacitive sensing and transducer 107 to convert the displacement of a resonating element (e.g., a proof-mass) into a sensed capacitance variation signal. The sensed capacitance variation signal is converted into a sensed voltage signal by C2V converter 104. The sensed voltage signal is input into rate signal demodulator circuit 110, which uses reference phase 106 to demodulate a rate signal that carries angular rate information. The demodulated rate signal can be further processed to remove out-of-band noise using, for example, filter 111 (e.g., a low pass). The filtered rate signal is then digitized by ADC 112a into a digital rate signal. The digital rate signal input into digital processing circuit 103 for quadrature-induced rate offset compensation over temperature.

Drive circuit 102 includes transducer 121, C2V converter 122, phase-locked loop (PLL) 117, automatic gain controller (AGC) 120, drive modulator 118 and peak detector 119. Transducer 121 converts the displacement of a resonating element (not shown) to provide a capacitance variation signal, which is converted by C2V converter 122 into a drive voltage signal. The drive voltage signal is feed into PLL 117, which generates reference phase 106 (e.g., a high frequency clock signal) that is related to the phase of the output of C2V converter 122. Peak detector 119 and AGC 120 are used together to adjust the gain of the drive voltage signal according to the output of C2V converter 122. Drive modulator 118 is coupled to transducer 121 and AGC 120 and is used to drive the resonating element to generate the capacitance variation signal according to the gain provided by AGC 120. The capacitance variation signal is converted into the drive voltage signal by C2V converter 122.

Digital processing circuit 103 includes decimation filter 114 (to reduce the sample rate of the rate signal), static coupling coefficient 115($a_o$), and temperature coefficient 116($a_1$(T)). Digital processing circuit 103 is coupled to temperature sensor 113 (e.g., a thermocouple or thermopile sensor) through ADC 112b. Digital processing circuit 103 can be implemented in discrete digital circuitry, such as an application-specific integrated circuit (ASIC), or in a digital signal processor (DSP), or in a general purpose processor, such as a central processing unit (CPU) or in a FPGA. In an embodiment, coefficients 115, 116 are stored in one or more storage devices, such as cache memory (e.g., flash memory) or hardware registers in an ASIC, CPU or DSP. In an embodiment, the registers can be programmed by a user or by another device or processor. Coefficients 115, 116 can be determined during fabrication/testing of the MEMS gyro sensor and, in some embodiments, the coefficients can be automatically adapted in the field using a filter that models the temperature coefficients as states (e.g., a Kalman or least squares filter). In the embodiment shown, digital processing circuit 103 outputs the gyro rate (Rate$_{Out}$) and gyro temperature (Temp$_{Out}$), which can be further processed by another processor (e.g., an application processor) and provided to one or more applications, as described in reference to FIG. 7. Rate$_{Out}$ includes the measured rate Rate$_{Meas}$ that has been compensated using the thermal compensation value $\alpha_T = \alpha_1 T$:

$$\text{Rate}_{Out} = \text{Rate}_{Meas} + (\alpha_0 + \alpha_1 \cdot T), \qquad [2]$$

where Rate$_{Meas}$ is the measured rate, $\alpha_0$ is a static coupling coefficient, $\alpha_1$ is a temperature coefficient and T is temperature.

An advantage of system 100 is that the quadrature signal is nulled at the inputs of C2V converter 104 in the analog domain by coupling the inputs to the drive signal generated by drive circuit 102 through phase inverter 109 and differential coupling capacitors 108. The nulling of the quadrature signal allows for a larger rate signal to be output by C2V converter 104, thereby improving the SNR at the input of C2V converter 104. A disadvantage of system 100 is that the quadrature signal is not available post-ADC for quadrature-induced rate offset compensation over temperature in the digital domain.

Figure 2:
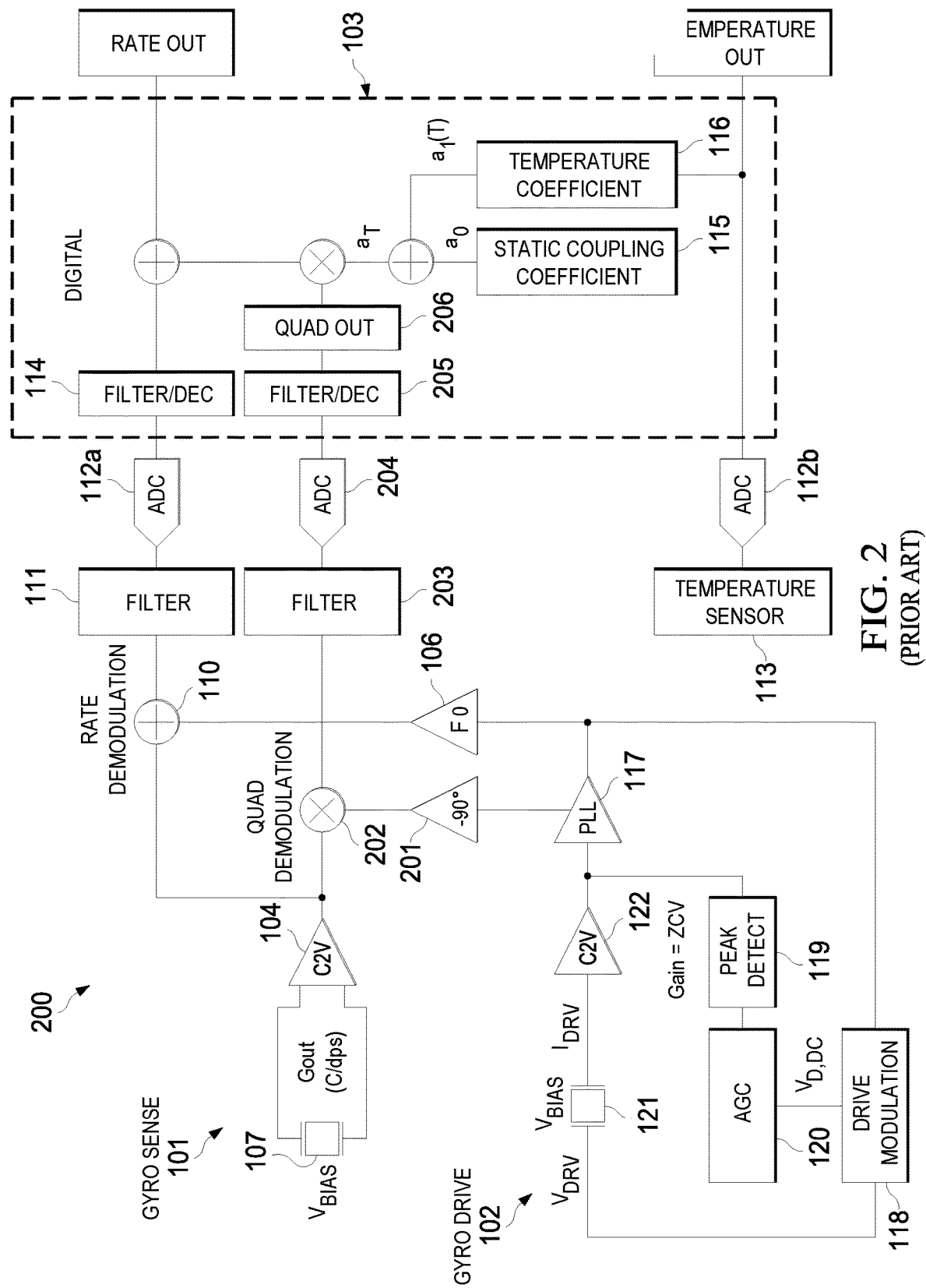
FIG. 2 is a block diagram of an example system for quadrature compensation that uses a digitized quadrature signal to adaptively compensate quadrature-induced rate offset over temperature in the digital domain, according to an embodiment.

FIG. 2 is a block diagram of an example system 200 for quadrature feedback compensation that uses a digitized quadrature signal to compensate quadrature-induced rate offset over temperature in the digital domain, according to an embodiment.

System 200 operates in a similar manner as system 100 except that the quadrature signal is not nulled at the input of C2V converter 104 in the analog domain. Rather, the phase of drive signal output by PLL 117 is inverted by phase inverter 109 and used to demodulate the quadrature signal. The demodulated quadrature signal is then filtered by filter 203 (e.g., a low pass filter) and digitized by ADC 204. In digital processing circuit 103, the digitized quadrature signal is decimated using filter 205 to produce quadrature output 206 (Quad$_{Out}$). Quad$_{Out}$ 206 is combined with coefficients 115, 116 to generate a thermal compensation value $\alpha_T = \alpha_0 + \alpha_1(T)$, which is used to compensate the demodulated gyro rate Rate$_{Meas}$ to provide Rate$_{Out}$:

$$\text{Rate}_{Out} = \text{Rate}_{Meas} + \text{Quad}_M \cdot (\alpha_0 + \alpha_1 \cdot T), \qquad [3]$$

where Rate$_{Meas}$ is the measured rate, Quad$_M$ is the mechanical quadrature, $\alpha_0$ is a static coupling coefficient, $\alpha_1$ is a temperature coefficient and T is temperature.

An advantage of system 200 is that the quadrature signal is used in the digital processing circuit 103 to adaptively compensate the quadrature-induced rate offset over temperature. A disadvantage of system 200 is that the quadrature signal is not nulled at the input of C2V 104 and G$_{Out}$ is not optimized.

Example Quadrature ADC Feedback Compensation System

Figure 3:
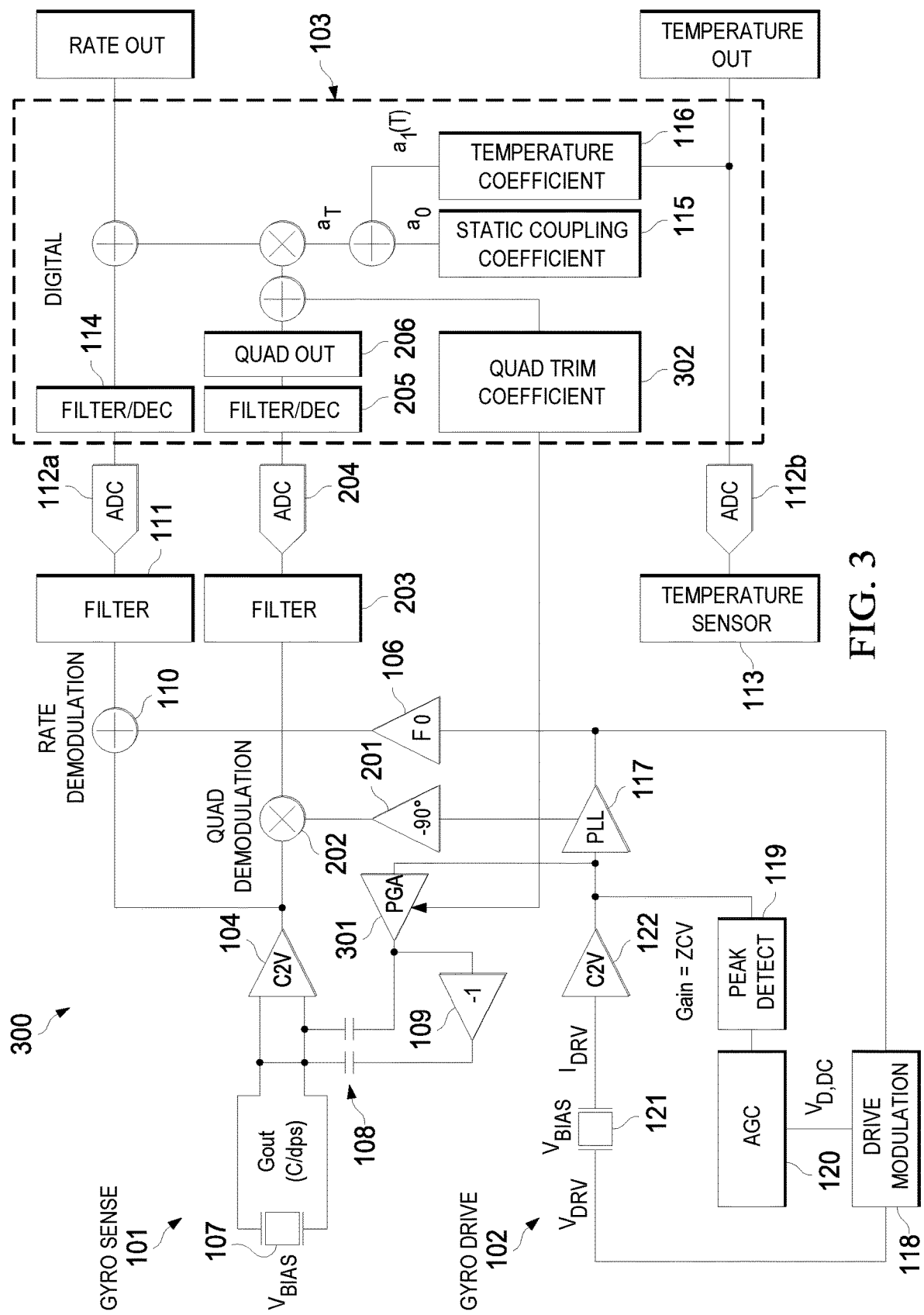
FIG. 3 is a block diagram of an example system for quadrature ADC feedback compensation that uses a quadrature compensation value to null the mechanical quadrature signal at the inputs of a C2V converter in the analog domain, and to adaptively compensate quadrature-induced rate offset over temperature in the digital domain, according to an embodiment.

FIG. 3 is a block diagram of an example system 300 for quadrature ADC feedback compensation that uses quadrature compensation value to null the quadrature signal at the inputs of a C2V converter in the analog domain, and to compensate quadrature-induced rate offset over temperature in the digital domain, according to an embodiment.

System 300 combines the architectures systems 100 and 200 and includes PGA 301 and quadrature compensation value 302. Quadrature compensation value 302 can be user-selectable and stored or programmed in, for example, cache memory, a hardware register or FPGA. Quadrature compensation value 302 (e.g., a quadrature trim coefficient) is used to set the gain of PGA 301 to null the analog quadrature signal at the inputs of C2V converter 104, and is also applied (e.g., added) to the digitized quadrature signal to compensate the quadrature-induced rate offset in the digital rate signal over temperature in the digital domain. For this design, Rate$_{Out}$ is given by:

$$\text{Rate}_{Out} = \text{Rate}_{Meas} + (\text{Quad}_M + \text{Quad}_{Trim}) \cdot (\alpha_0 + \alpha_1 \cdot T), \qquad [4]$$

where Rate$_{Meas}$ is the demodulated gyro rate signal, Quad$_M$ is the residual demodulated gyro quadrature signal after analog quadrature nulling, Quad$_{Trim}$ is the compensation value, $\alpha_0$ is the static coupling coefficient, $\alpha_1$ is the temperature coefficient and T is temperature. Here, the measured residual quadrature plus the quadrature trim value is the mechanical quadrature: Quad$_M$=(Quad$_{Meas}$+Quad$_{Trim}$), allowing for compensation of the TCO (refer to Equation [3]).

An advantage of system 300 is that it improves the SNR at the output of C2V 104 in the analog domain, and also allows for adaptive compensation of quadrature-induced rate offset over temperature in the digital domain, thus eliminating the disadvantages described above in reference to systems 100 and 200.

Figure 4A:
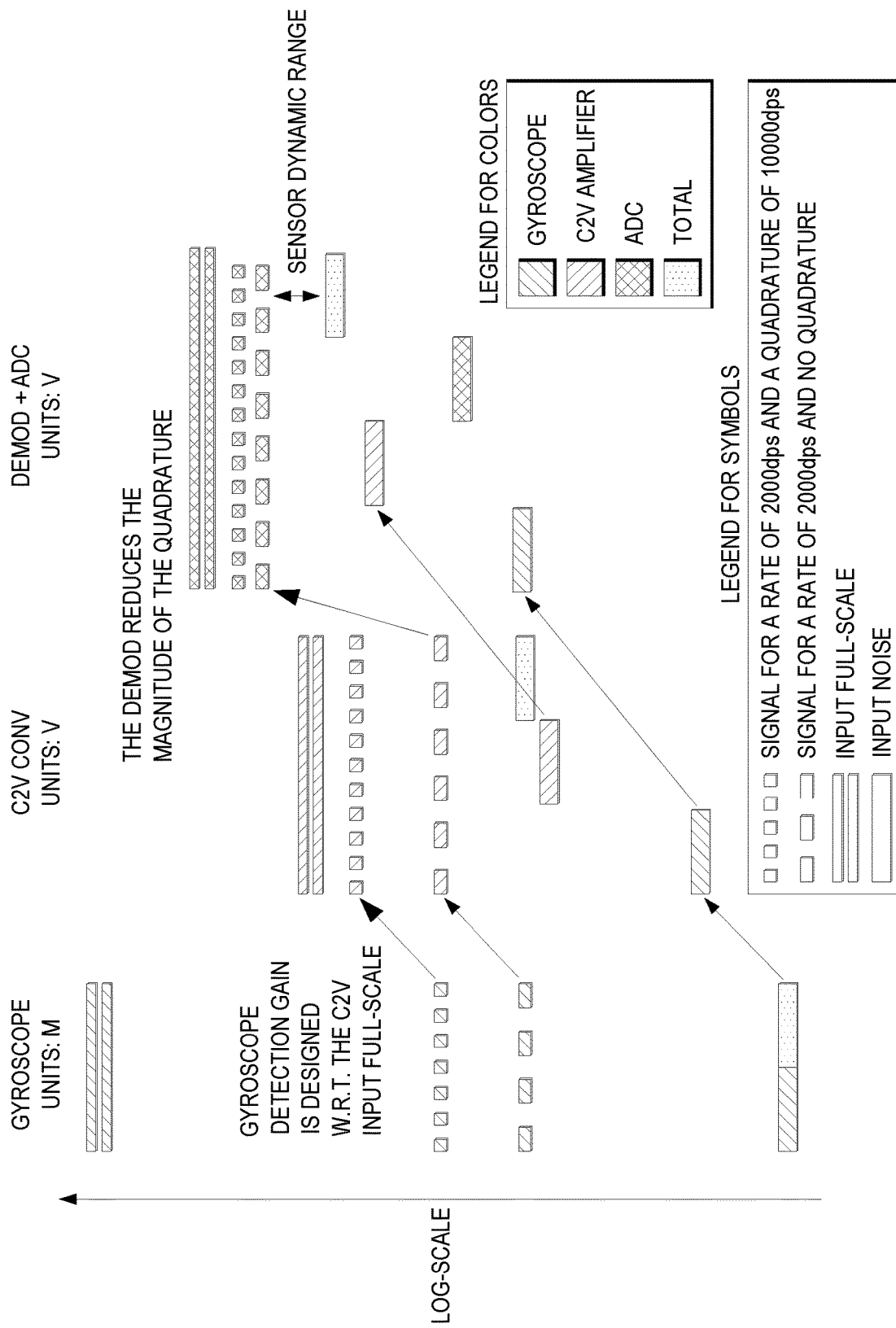
FIG. 4A is a plot illustrating the effect of quadrature on the dynamic range and SNR of a MEMS gyro with the prior art implementation depicted in FIG. 2.

FIG. 4A is a graph illustrating the effect of quadrature on the dynamic range of a MEMS gyro that uses system 200 of FIG. 2, according to an embodiment. The y-axis is a log scale and the x-axis represents the dynamic range of the MEMS gyro at different stages of the signal chain: gyro sensor (meter), C2V converter (volts) and rate demodulator plus ADC (volts). A first plot, in dotted line, represents a rate signal of 2000 dps with a quadrature signal of 10000 dps. A second plot, in dashed line, represents a rate signal of 2000 dps with no quadrature signal. A third plot, in double-line, represents the input full-scale of the stage. A fourth plot, in thick line, represents the stage input noise. The gyro detection gain scales plots 1, 2 and 4 by the same magnitude. The gain is represented by the translation of plots 1, 2 and 4 between the gyroscope stage and the C2V converter stage. The system is designed so that plot 1 remains below plot 3 of the C2V converter.

The gyro gain is a variable based on the mechanical design of the gyroscope while the input full-scale of the C2V converter is based on the design of the C2V converter stage. At the C2V converter stage the noise is additive, which increases the total noise of the system. In the demodulation stage, the quadrature amplitude is reduced in 110 of FIG. 2. It allows amplification of the C2V converter signal, which is shown as a translation of plots 2 and 4 between the C2V converter stage and the demod+ADC stage. Again, the noise of the demod+ADC stage is added, which increases the total noise. Finally the sensor dynamic range is represented as the distance between plot 2 and 4 in the demod+ADC stage.

Figure 4B:
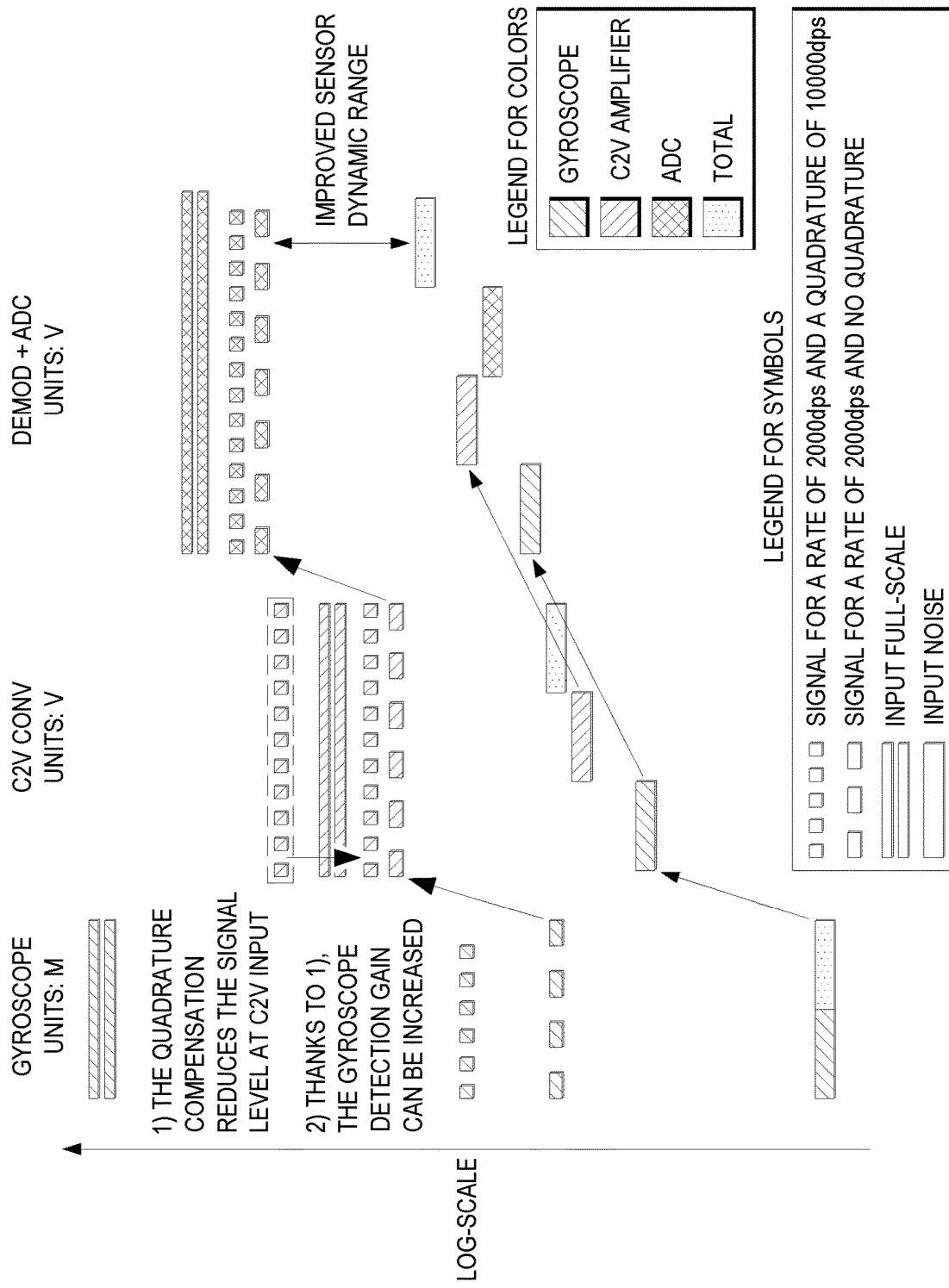
FIG. 4B is a plot illustrating the effect of quadrature on the dynamic range and SNR of a MEMS gyro that uses a compensation value to null the quadrature signal at the input of the C2V converter, and to adaptively compensate for quadrature-induced rate offset in the digital domain over temperature, according to an embodiment.

Referring to FIG. 4B, and comparing with FIG. 3, the quadrature is compensated using 109 of FIG. 3. It is represented by plot 1 in the C2V converter stage. Plot 1 represents the case where the quadrature compensation is not implemented. With the compensation implemented, plot 1 is reduced as shown on FIG. 4A with an arrow. Thanks to the quadrature compensation, the gyroscope detection gain can be increased compared to FIG. 4A. This gain increase is represented by a larger translation of plot 2 and plot 4 between the gyroscope stage and the C2V converter stage. Due to the large gyroscope detection gain, the C2V converter gain can be reduced to achieve a similar input full-scale at the demod+ADC stage. As shown on FIG. 4A, the larger gyroscope detection gain increases the distance between plot 1 and plot 4 in the C2V converter stage, which represents the dynamic range of the signal in the C2V converter stage. Thus, the sensor dynamic range represented by the distance between plot 1 and plot 4 in the demod+ADC stage is also improved.

Figure 5:
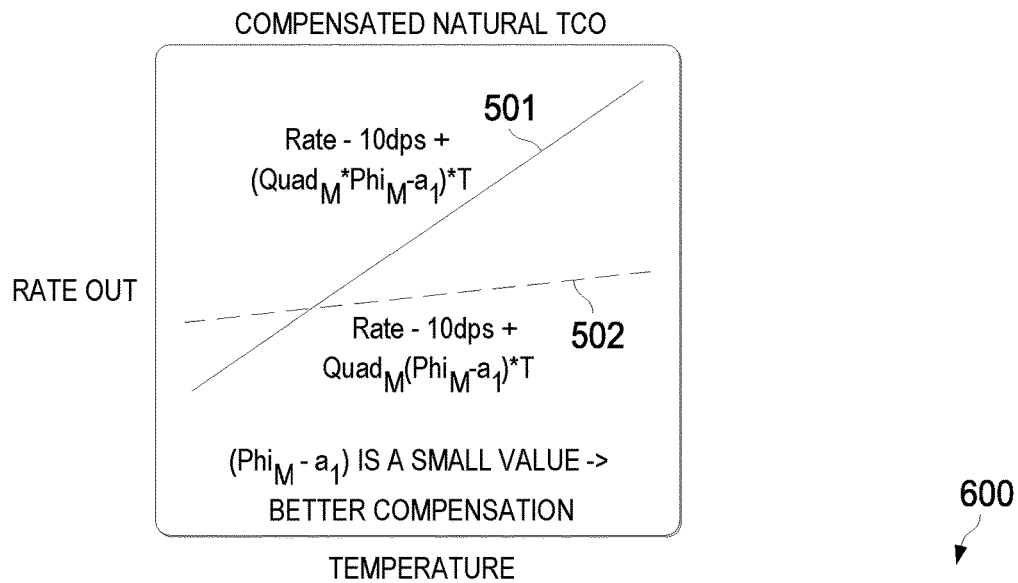
FIG. 5 illustrates differences in the temperature coefficient offset (TCO) with and without mechanical quadrature used to adaptively compensate quadrature-induced rate offset over temperature in the digital domain, according to an embodiment.

FIG. 5 illustrates differences in the temperature coefficient offset (TCO) with and without mechanical quadrature used to compensate quadrature-induced rate offset in the digital domain, according to an embodiment. Line 501 shows the output using a compensation strategy without quadrature, as referenced in Equation [2]. In this example, the output includes a static bias (10 dps), the natural MEMS TCO ($Quad_M *Phi_M$), compensation coefficient $a_1$ and temperature T. In this example, changes in quadrature results in a change in TCO that is not tracked by the compensation. In contrast, line 502 shows the output using a compensation strategy using quadrature, as referenced in Equation [3]. In this example, the output still includes a static bias (10 dps) and the natural MEMS TCO ($Quad_M *Phi_M$). But now the compensation coefficient $a_1$ is a correction on the phase error ($Phi_M$), which results in a smaller TCO value that tracks with changes in quadrature value.

Example Process

Figure 6:
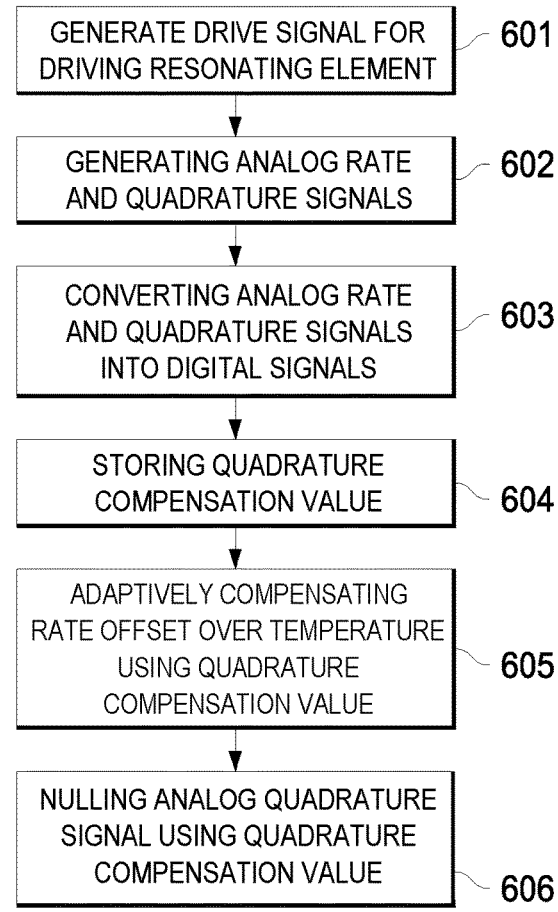
FIG. 6 is a flow diagram of an example process for quadrature ADC feedback compensation for the system of FIG. 3, according to an embodiment.

FIG. 6 is a flow diagram of an example process 600 for quadrature ADC feedback compensation, according to an embodiment. Process 600 can be implemented using, for example, system 300 shown in FIG. 3.

Process 600 can begin by generating an analog drive signal for driving a resonating element (601). For example, a drive circuit can include a drive modulator that drives the resonating element into resonance, as described in reference to FIG. 1.

Process 600 continues by generating analog rate and quadrature signals based on a change of capacitance due to the resonating element (602). For example, a transducer can generate a capacitance variation signal in response to the resonating element. A C2V converter can convert the capacitance variation signal into an analog voltage signal that includes in-phase and quadrature signal components, where the quadrature signal component includes mechanical quadrature error and the in-phase signal component carries the rate information due to Coriolis force.

Process 600 continues by converting the analog rate and quadrature signals into digital rate and quadrature signals (603). For example, the analog rate and quadrature signals can be synchronously demodulated using the drive signal, and then one or more ADCs can be used to convert the analog rate and quadrature signals into digital rate and quadrature signals. In some implementations, the analog rate and quadrature signals are filtered (e.g., using low pass filters) prior to their conversion.

Process 600 continues by storing a quadrature compensation value (e.g., a quadrature trim coefficient) in cache memory, a hardware register or a FPGA (604).

Process 600 continues by adaptively compensating a rate offset of the digital rate signal over temperature using the digital quadrature signal, the quadrature compensation value and temperature data (605). For example, the digital rate signal can be adaptively compensated in the digital domain using the digital quadrature signal, the quad trim coefficient, temperature data, a static coupling coefficient and a temperature coefficient, as described by Equation [4].

Process 600 continues by nulling the analog quadrature signal component at the input of the C2V converter using the drive signal and a quadrature compensation value (606). For example, the drive signal can be input into a PGA that uses the stored quadrature compensation value to null the analog quadrature signal. In an embodiment, the PGA can be an operational amplifier whose gain is set by the quadrature compensation value. The output of the PGA can be coupled into differential inputs of the C2V converter using coupling capacitors.

Example System Architecture

Figure 7:
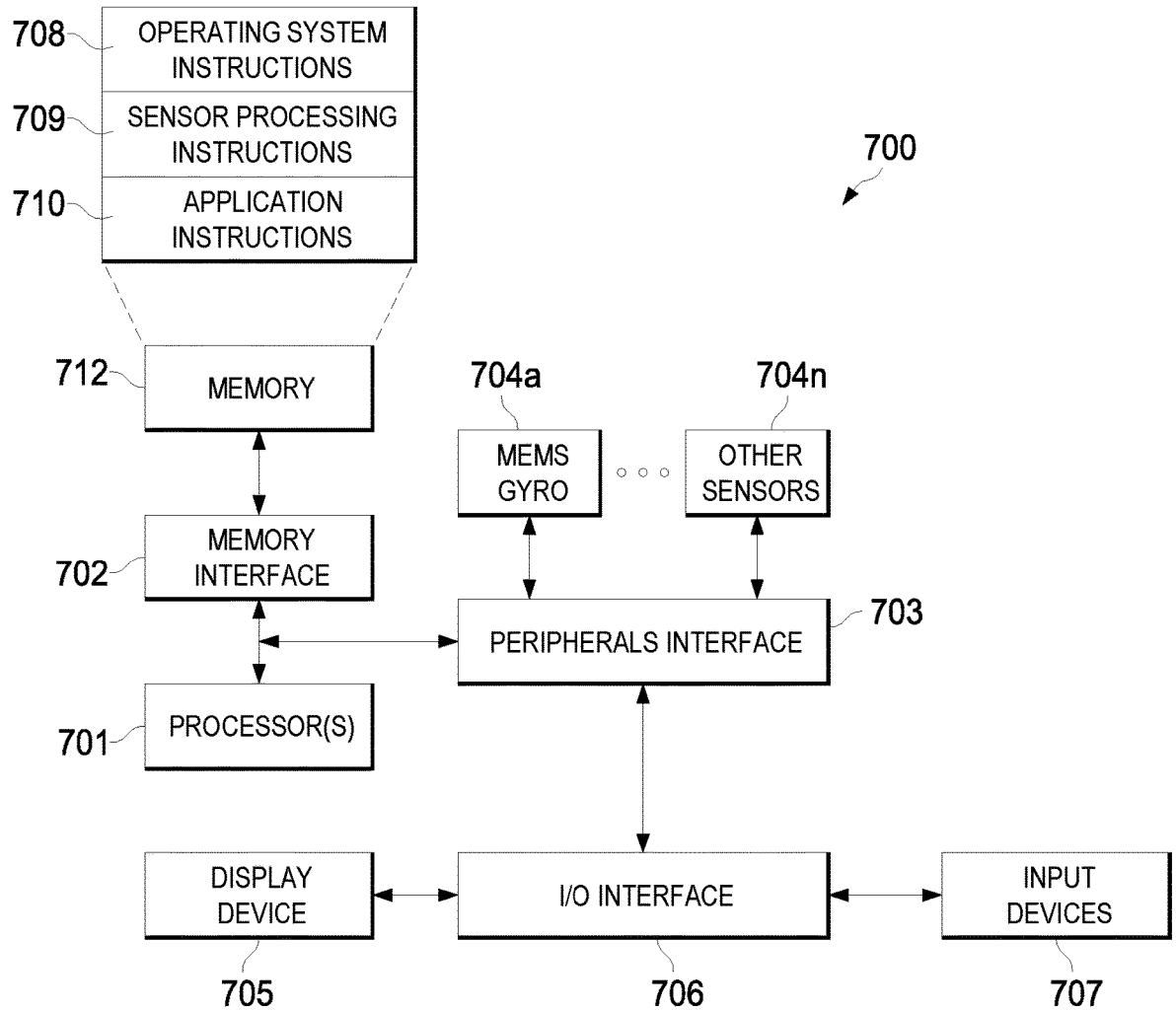
FIG. 7 is architecture for an electronic system that includes a MEMS gyro sensor that uses quadrature ADC feedback compensation as described in reference to FIG. 3, according to an embodiment.

FIG. 7 is architecture for an electronic system that includes a MEMS gyro sensor that uses quadrature ADC feedback compensation as described in reference to FIG. 3, according to an embodiment. Architecture 700 can be included in any electronic device that uses motion sensors, including but not limited to: smart phones, tablet computers, wearable devices (e.g., a smart watch) and automotive systems.

Architecture 700 includes processor(s), memory interface 702, peripherals interface 703, motion sensors 704a . . . 704n, display device 705 (e.g., touch screen, LCD display, LED display), I/O interface 706 and input devices 707 (e.g., touch surface/screen, hardware buttons/switches/wheels, virtual or hardware keyboard, mouse). Memory 712 can include high-speed random access memory and/or non-volatile memory, such as one or more magnetic disk storage devices, one or more optical storage devices and/or flash memory (e.g., NAND, NOR).

Memory 712 stores operating system instructions 708, sensor processing instructions 709 and application instructions 710. Operating system instructions 708 include instructions for implementing an operating system on the device, such as iOS, Darwin, RTXC, LINUX, UNIX, WINDOWS, or an embedded operating system such as VxWorks. Operating system instructions 708 may include instructions for handling basic system services and for performing hardware dependent tasks. Sensor-processing instructions 709 perform post-processing on motion sensor data (e.g., averaging) and provide control signals to motion sensors. Application instructions 710 implement software programs that use data from one or more motion sensors 704a . . . 704n, such as navigation, digital pedometer, tracking or map applications. At least one motion sensor 704a is a capacitive-based MEMS gyro that is compensated by system 300, described in reference to FIG. 3.

For example, in a navigation application executed on a smart phone, angular rate data is provided by the capacitive-based MEMS gyro to processor(s) 701 through peripheral interface 703. Processor(s) 701 execute sensor-processing instructions 709, to perform further processing of the angular rate data (e.g., averaging). Processor(s) 701 execute instructions for a navigation application. The angular rate data is used to determine the orientation of the smart phone in a reference coordinate system that can be used by the navigation application to perform a variety of navigation functions (e.g., turn-by-turn instructions). Accordingly, navigation application benefits from the compensated capacitive-based MEMS gyro by obtaining more accurate angular rate measurements of acceleration from which a more accurate device orientation can be determined.

While this document contains many specific implementation details, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A system for compensating rate offset of a microelectromechanical systems (MEMS) gyroscope, comprising:
an analog processing chain comprising:
a drive circuit configured to generate an analog drive signal for driving a resonating element into resonance;
a sense circuit coupled to the drive circuit and the resonating element, the sense circuit configured to generate an analog rate signal and an analog quadrature signal in response to a change in capacitance output by the MEMS gyroscope; and
one or more analog-to-digital converters coupled to the sense circuit and configured to convert the analog rate and analog quadrature signals into digital rate and digital quadrature signals, respectively;
a compensation circuit coupled to the sense circuit and configured to null the analog quadrature signal using the analog drive signal and a quadrature compensation value; and
a digital processing chain coupled to the analog processing chain, the digital processing chain comprising:
a digital processing circuit configured to adaptively compensate quadrature-induced rate offset of the digital rate signal over temperature using the digital quadrature signal, the quadrature compensation value and temperature data.

2. The system of claim 1, where the sense circuit further comprises:
a transducer configured to convert a displacement of the resonating element into a sensed capacitance variation signal;
a capacitance-to-voltage (C2V) converter configured to convert the sensed capacitance variation signal into a sensed voltage signal;
a rate signal demodulator circuit configured to demodulate the sensed voltage signal to extract the analog rate signal; and
a quadrature signal demodulator circuit configured to demodulate the sensed voltage signal to extract the analog quadrature signal.

3. The system of claim 2, further comprising a filter configured to process the analog rate signal or the analog quadrature signal to remove out-of-band noise.

4. The system of claim 2, further comprising:
a programmable amplifier;
a phase inverter coupled to an output of the programmable amplifier and configured to invert a phase of an output signal of the programmable amplifier; and
a first capacitor coupled to an output of the phase inverter and a first input of the C2V converter, the first capacitor coupling the output signal with inverted phase into the first input of the C2V converter; and
a second capacitor coupled to the programmable amplifier and to a second input of the C2V converter, the second capacitor coupling the output of the programmable amplifier into the second input of the C2V converter.

5. The system of claim 4, wherein the quadrature compensation value is a quadrature trim coefficient stored in a programmable register is coupled to the programmable amplifier.

6. The system of claim 5, further comprising:
a first analog-to-digital (ADC) converter configured to convert the analog quadrature signal into a digital quadrature signal;
calculate a first sum of the quadrature trim coefficient and the digital quadrature signal;
retrieve a temperature coefficient based on the temperature data;
calculate a second sum of the temperature coefficient and a static coupling coefficient;
calculate a product of the first sum and the second sum;
calculate a third sum of the product and the digital rate signal; and
output the third sum as a compensated digital rate signal.

7. A method of compensating rate offset of a microelectromechanical systems (MEMS) gyroscope, comprising:

generating, by a drive circuit coupled to a resonating element, an analog drive signal for driving the resonating element into resonance;

generating, by a sense circuit coupled to the drive circuit and the resonating element, an analog rate signal and an analog quadrature signal in response to a change in capacitance output by the MEMS gyroscope;

converting, by one or more analog-to-digital converters coupled to the sense circuit, the analog rate signal and the analog quadrature signal into a digital rate signal and a digital quadrature signal, respectively;

nulling, by a compensation circuit coupled to the sense circuit, the analog quadrature signal using the analog drive signal and a compensation value; and adaptively compensating, by a digital processing circuit, a quadrature-induced rate offset of the digital rate signal over temperature using the digital quadrature signal, the compensation value and temperature data.

8. The method of claim 7, where the sense circuit further comprises:
converting a displacement of the resonating element into a sensed capacitance variation signal;
converting the sensed capacitance variation signal into a sensed voltage signal;
demodulating the sensed voltage signal to extract the analog rate signal; and
demodulating the sensed voltage signal to extract the analog quadrature signal.

9. The method of claim 8, further comprising:
processing, by a filter, the analog rate signal or the analog quadrature signal to remove out-of-band noise.

10. The method of claim 8, further comprising:
inverting, by a phase inverter, a phase of an output signal of a programmable amplifier;
coupling, by a first capacitor, the output signal having the inverted phase into a first input of the C2V converter; and
coupling, by a second capacitor coupled to the programmable amplifier and to a second input of the C2V converter, the output signal of the programmable amplifier to a second input of the C2V converter.

11. The method of claim 10, wherein the quadrature compensation value is a quadrature trim coefficient stored in a programmable register coupled to the programmable amplifier.

12. The method of claim 11, further comprising:
converting the analog quadrature signal into a digital quadrature signal;
calculating a first sum of the quadrature trim coefficient and the digital quadrature signal;
retrieving a temperature coefficient based on the temperature data;
calculating a second sum of the temperature coefficient and a static coupling coefficient;
calculating a product of the first sum and the second sum;
calculating a third sum of the product and the digital rate signal; and
outputting the third sum as a compensated digital rate signal.

13. An electronic system comprising:
a drive circuit configured to generate an analog drive signal for driving a resonating element into resonance;
a sense circuit coupled to the drive circuit and the resonating element, the sense circuit configured to generate an analog rate signal and an analog quadrature signal in response to a change in capacitance output by a MEMS gyroscope; and one or more analog-to-digital converters coupled to the sense circuit and configured to convert the analog rate and analog quadrature signals into digital rate and digital quadrature signals, respectively;

a compensation circuit coupled to the sense circuit and configured to null the analog quadrature signal using the analog drive signal and a quadrature compensation value; and a digital processing circuit configured to adaptively compensate quadrature-induced rate offset of the digital rate signal over temperature using the digital quadrature signal, the quadrature compensation value and temperature data;

one or more processors;
memory coupled to the one or more processors and storing instructions that when executed by the one or more processors, cause the one or more processors to perform operations comprising:
obtaining the digital rate signal;
calculating orientation data of the electronic system using the digital rate signal; and
providing the orientation data to one or more client applications or electronic system components.

14. The system of claim 13, where the sense circuit further comprises:
a transducer configured to convert a displacement of the resonating element into a sensed capacitance variation signal;
a capacitance-to-voltage (C2V) converter configured to convert the sensed capacitance variation signal into a sensed voltage signal;
a rate signal demodulator circuit configured to demodulate the sensed voltage signal to extract the analog rate signal; and
a quadrature signal demodulator circuit configured to demodulate the sensed voltage signal to extract the analog quadrature signal.

15. The system of claim 14, further comprising a filter configured to process the analog rate signal or the analog quadrature signal to remove out-of-band noise.

16. The electronic system of claim 14, further comprising:
a programmable amplifier;
a phase inverter coupled to an output of the programmable amplifier and configured to invert a phase of an output signal of the programmable amplifier; and
a first capacitor coupled to an output of the phase inverter and a first input of the C2V converter, the first capacitor coupling the output signal with inverted phase into the first input of the C2V converter; and
a second capacitor coupled to the programmable amplifier and to a second input of the C2V converter, the second capacitor coupling the output of the programmable amplifier into the second input of the C2V converter.

17. The electronic system of claim 16, wherein the quadrature compensation value is a quadrature trim coefficient stored in a programmable register is coupled to the programmable amplifier.

18. The electronic system of claim 17, further comprising:
a first analog-to-digital (ADC) converter configured to convert the analog quadrature signal into a digital quadrature signal;
calculate a first sum of the quadrature trim coefficient and the digital quadrature signal;
retrieve a temperature coefficient based on the temperature data;
calculate a second sum of the temperature coefficient and a static coupling coefficient;

calculate a product of the first sum and the second sum;
calculate a third sum of the product and the digital rate signal; and
output the third sum as a compensated digital rate signal.

* * * * *